United States Patent [19]
Orth

[11] Patent Number: 5,874,202
[45] Date of Patent: Feb. 23, 1999

[54] PROCESS AND SYSTEM FOR FLATTENING SECONDARY EDGEBEADS ON RESIST COATED WAFERS

[75] Inventor: Jonathan Alan Orth, Los Gatos, Calif.

[73] Assignee: Advanced Micro Devices, Inc., Sunnyvale, Calif.

[21] Appl. No.: 989,893

[22] Filed: Dec. 12, 1997

Related U.S. Application Data

[62] Division of Ser. No. 306,920, Sep. 16, 1994, Pat. No. 5,750,317.
[51] Int. Cl.$^6$ ........................................................ G03F 7/16
[52] U.S. Cl. ............................. 430/327; 430/311; 134/33; 427/240; 427/273
[58] Field of Search ..................................... 430/311, 313, 430/317, 322, 325, 327, 328, 331; 134/33, 34, 38; 427/532, 240, 336, 273

[56] References Cited

U.S. PATENT DOCUMENTS

| 4,732,785 | 3/1988 | Brewer | 427/240 |
| 5,426,017 | 6/1995 | Johnson | 430/331 |

*Primary Examiner*—Kathleen Duda

[57] ABSTRACT

A method and system of flattening resist mounds formed during a wet edgebead operation. The wet edgebead operation is used to remove edgebeads formed when a resist material is deposited on a semiconductor wafer. Solvent is introduced to the semiconductor wafer at the area containing the resist mounds to soften them, and the semiconductor wafer is spun at a high speed to flatten the mounds.

13 Claims, 7 Drawing Sheets

Prior Art

PROCESS AND SYSTEM FOR FLATTENING SECONDARY EDGEBEADS ON RESIST COATED WAFERS

This application is a Divisional of application Ser. No. 08/306,920 filed Sep. 16, 1994.

BACKGROUND OF THE INVENTION

1. Field of the Invention

The present invention generally relates to a process and system for removing extraneous resist material on a semiconductor wafer which results from the dispensing of the resist material onto the semiconductor wafer. The present invention is more particularly related to the removing of extraneous resist material on a semiconductor wafer which is formed when a wet edgebead operation is performed on the semiconductor wafer to remove "edgebeads," the extraneous resist material which is formed during the wet edgebead operation.

2. Background of the Related Art

Photolithography, the process of exposing resist coated semiconductor wafers to develop patterns in the resist material, is currently performed or implemented with a photoresist type material. A photoresist type material is a solution of polymers bonded to photoactive compounds. The photoactive compounds are exposed to light according to a predetermined pattern, and developed forming patterns in the resist material. The developed patterns are used in the forming of devices in the semiconductor wafer.

Photoresist material is typically deposited on the semiconductor water as a sticky material which when dried becomes brittle. Accordingly, the photoresist material has a tendency to flake and create small particles which can infiltrate and destroy devices embedded or formed in the semiconductor wafer. Since the resist material may significantly affect the operation of a semiconductor chip, a great deal of attention has been given to ways of preventing the resist material from creating these small particles or flakes which can destroy the devices in the semiconductor wafer. For example, it is generally understood that when the semiconductor wafer is coated with the resist material, small balls or beads of photoresist remain stuck to the edges of the wafer. These beads are typically called "edgebeads." The edgebeads can flake and create various defects in the semiconductor wafer as described above. Thus, the edgebeads can significantly reduce the yield of properly operating semiconductor wafers, increasing cost of manufacture.

To combat problems resulting from the normal edgebeads formed during the coating of the semiconductor wafer with resist material, many manufacturers incorporate a "wet edgebead operation" which is used to remove the edgebeads from a semiconductor wafer. The wet edgebead operation consists of dispensing solvent at the wafer edge to dissolve the edgebeads from the upper edge, back and side of the wafer. By performing the wet edgebead operation, the edgebeads can be removed to some extent, thereby reducing or minimizing the flaking of resist material and the formation of defects in the semiconductor wafer.

Even though the wet edgebead operation has been previously performed, semiconductor wafers have still encountered significant device failures. Accordingly, it is desirable to determine the cause of the semiconductor failures. Once the cause of the semiconductor failures is determined, it is also desirable to formulate a solution to correct the semiconductor failures.

It is further desirable that any solution or process used to correct the semiconductor failures be implemented in a continuous process, and also be incorporated in or used with the existing process of depositing resist material onto the semiconductor wafer.

SUMMARY OF THE INVENTION

It is a feature and advantage of the present invention to provide a practical solution to correcting the problem of semiconductor wafer failure. As part of this solution, it is a feature and advantage of the present invention to provide a solution which can be incorporated into the existing process of depositing the resist material on the semiconductor wafer in an efficient manner.

The present invention is based, in part, on identification of the problem which has resulted in significant semiconductor wafer failures due to the formation of secondary edgebeads which are formed when edgebeads are removed using the wet edgebead operation. Residual resist defects are generally produced at the secondary edgebead sites after the semiconductor wafer is coated with the resist material and after the resist material is exposed and developed for the formation of device regions. We have discovered that the residual resist defects are formed because the standard edge exposure and developing techniques used on the resist layer are unable to completely remove extraneous secondary edgebead material which is generated by the wet edgebead operation.

The present invention, by creating standard processing wet edgebead removal steps to remove the secondary edgebeads, provides a processing technique and system which is able to efficiently and significantly reduce the thickness of the extraneous or residual resist material which results from or is not removed by the wet edgebead operation. Since the present invention is able to reduce the thickness of residual resist material which is formed or remains after the wet edgebead operation using the techniques which are disclosed below, the standard edge exposure and developing steps are effective in removing substantially all of the remaining extraneous resist material which remains after the resist layer is deposited on the semiconductor wafer and after the standard wet edgebead operation is performed.

To achieve these and other features and advantages of the present invention, a method of depositing resist material onto a semiconductor wafer is provided. The method includes the steps of depositing the resist material onto the semiconductor wafer, and performing a wet edgebead operation to remove edgebeads formed at the edge of the semiconductor wafer during the depositing step. In addition, the method includes the step of performing a secondary edgebead flattening operation to remove secondary edgebeads formed during the performing step.

The present invention also provides a method of preparing a semiconductor wafer for etching. The method includes the steps of depositing resist material onto the semiconductor wafer and performing a wet edgebead operation to remove edgebeads formed at an edge of the semiconductor wafer during the depositing step. The method further provides the performing of a secondary edgebead removal operation to remove secondary edgebeads formed during the performing step and exposing the resist material deposited onto the semiconductor wafer to light in accordance with a predetermined pattern. Finally, the method includes the developing the resist material deposited onto the semiconductor wafer for device implantation in accordance with the pattern exposed in the exposing step.

The present invention also includes a method of flattening resist mounds formed during a wet edgebead operation. The wet edgebead operation is used to remove edgebeads formed when a resist material is deposited on a semiconductor wafer. The method includes the step of introducing solvent to the semiconductor wafer at the area containing the resist mounds to soften the resist mounds, and spinning the semiconductor wafer at a speed sufficient to flatten the resist mounds.

The present invention further includes a system for flattening resist mounds formed during a wet edgebead operation. The wet edgebead operation is used to remove edgebeads formed when a resist material is deposited on a semiconductor wafer. The system includes a device which introduces solvent to the semiconductor wafer at the area containing the resist mounds to soften the resist mounds, and a device which spins the semiconductor wafer at a speed sufficient to flatten the resist mounds.

These, together with other objects and advantages which will be subsequently apparent, reside in the details of construction and operation as more fully hereinafter described and claimed, with reference being had to the accompanying drawings forming a part hereof, wherein like numerals refer to like elements throughout.

DESCRIPTION OF THE PREFERRED EMBODIMENTS OF THE INVENTION

Figure 1A:
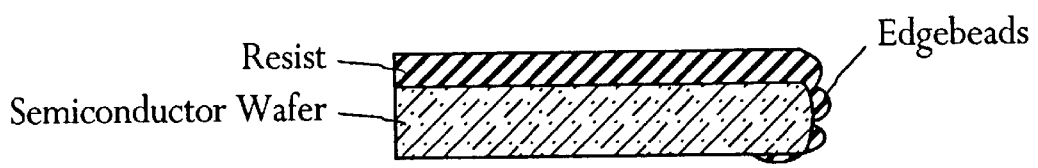
FIGS. 1(a)–1(c) are diagrams illustrating the standard process of depositing a resist layer on a semiconductor wafer and the standard wet edgebead operation.
Figure 1B:
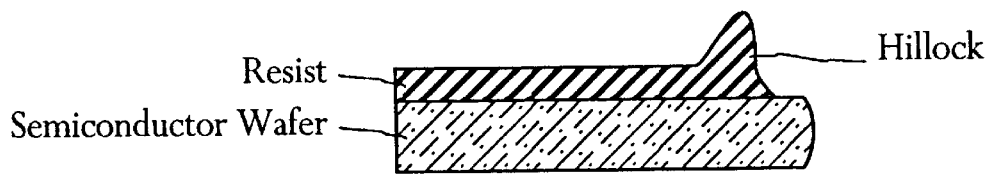

The present invention recognizes that the previous resist layer deposit processes are inferior since residual secondary edgebeads are formed on the semiconductor wafer which are not able to be removed during the standard edge exposure and developing processes. According to the standard edgebead removal process, a resist layer is deposited on the semiconductor wafer and small balls or beads adhere to the edges of the wafer as shown in FIG. 1(a). These edgebeads can flake and create serious problems or defects in the semiconductor wafer. To remove the edgebeads, a wet edgebead operation is performed by dispensing solvent at the wafer edge. It was postulated that when the solvent dissolves away the edgebeads during the wet edgebead operation, a certain amount of solvent is absorbed in the remaining resist material on the upper surface of the semiconductor wafer which borders where the solvent is dispensed to remove the edgebeads. This absorption of the solvent in the resist material causes the resist to bunch up or bead up and creates a ring of thick beads or mounds commonly called "hillocks" at the edge of the resist material on the upper surface of the wafer as shown in FIG. 1(b). The resist layer is then dried leaving the hillocks at the edge of the semiconductor wafer.

Figure 1C:
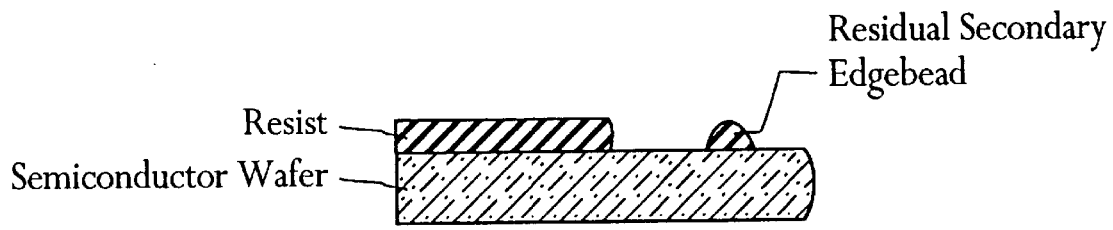

It was believed that after the standard edge exposure and developing steps which are used to create a pattern in the resist layer, these hillocks would be completely removed. However, a significant amount of defects were still being experienced in semiconductor wafers. Upon a detailed examination of the failed semiconductor wafers, we determined and discovered that small islands of resist material what is commonly termed secondary edgebeads were remaining on the semiconductor wafer at the edges which prevented the semiconductor wafer from being etched at those particular areas as shown in FIG. 1(c). We further recognized or discovered that these secondary edgebeads which formed on the semiconductor wafer as isolated patches of glass or silicon oxide could easily be separated from the surface of a semiconductor wafer and be redeposited on implanted devices in the semiconductor wafer causing significant device failures.

In addition to the discovery of the source or origin of the defects, we also recognized that it would be advantageous to flatten the hillocks which were formed after the standard flat edgebead removal operation was performed. Thus, a significant feature of the present invention is the flattening of the hillocks which form at the edge of the semiconductor wafer as a result of the wet edgebead removal operation.

Figure 5A:
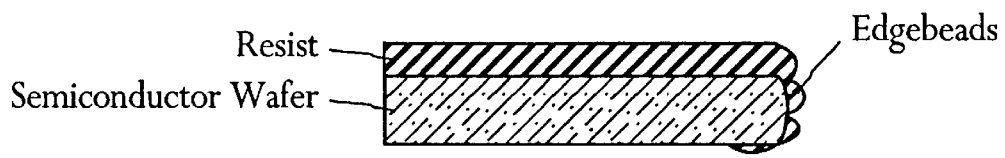
FIGS. 5(a)–5(d) are diagrams illustrating the process of depositing a resist layer onto a semiconductor wafer in accordance with the secondary edgebead removal operation of the present invention.
Figure 5B:
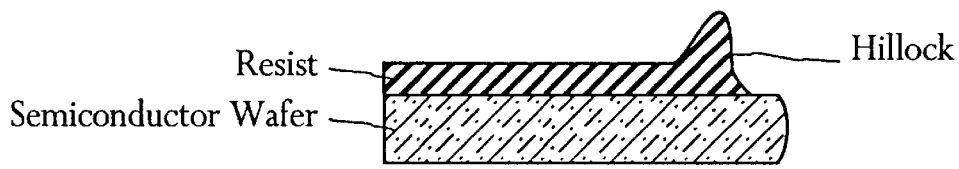
Figure 5C:
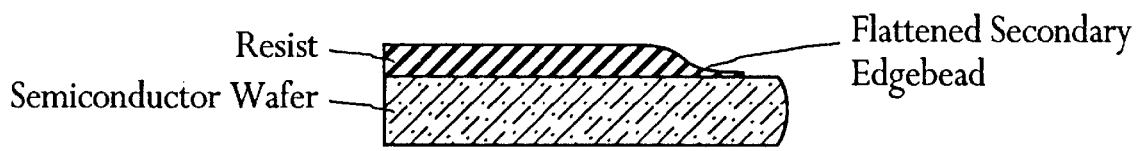
Figure 5D:
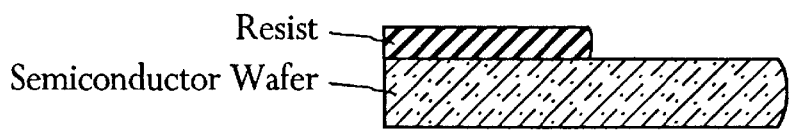

To accomplish this objective, these hillocks are softened by dispensing solvent thereon. Once these hillocks have softened, they may be flattened by spinning the semiconductor wafer at a very high spin speed. The hillocks are then substantially flattened as shown in FIG. 5(c). Thus, this high spin speed process step substantially eliminates the hillock and the formation of the residual secondary edgebeads which were present in previous edgebead removal techniques. After the high speed spin operation or step, the semiconductor wafer is then exposed and developed according to standard techniques which will easily remove the remaining flattened portions of the hillocks as shown in FIG. 5(d). Since these residual secondary edgebeads are able to be removed, semiconductor wafer failures have been significantly reduced, and an increased die yield was experienced or provided by the process and system of the present invention.

Figure 2:
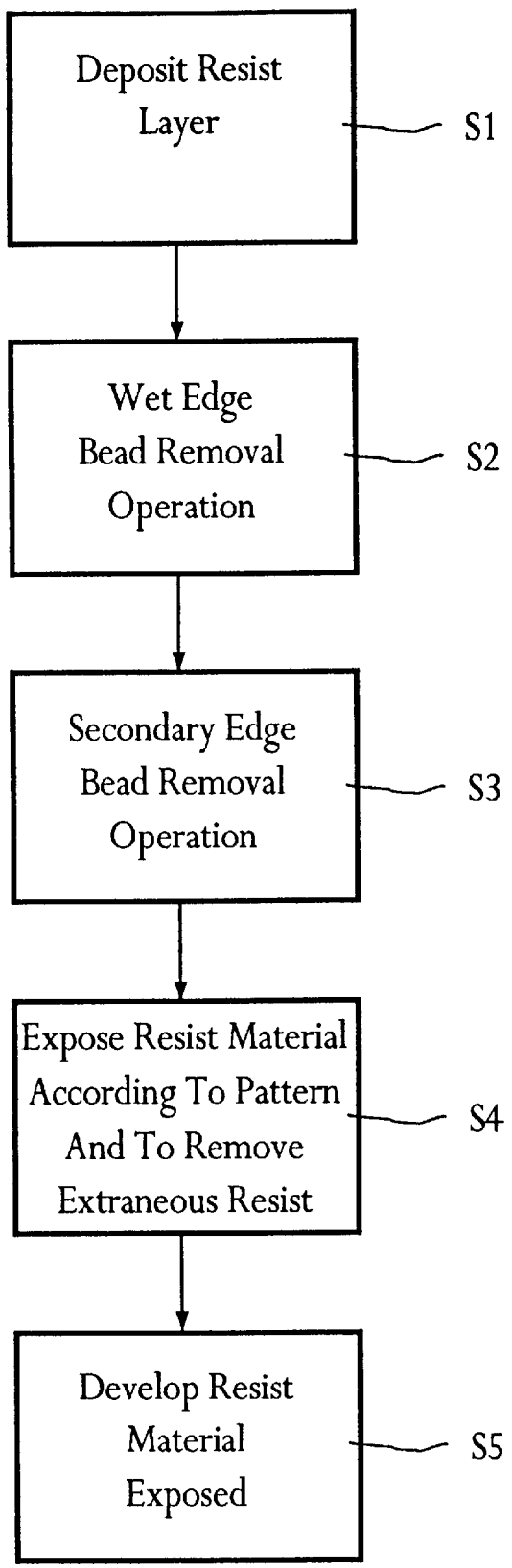
FIG. 2 is a flowchart of the process of the depositing of the resist layer onto the semiconductor wafer incorporating the secondary edgebead removal operation of the present invention.

FIG. 2 is a flowchart illustrating the basic overall steps or processes according to the principles of the present invention. As shown in FIG. 2, the resist layer deposit process according to the present invention generally includes the steps of depositing a resist layer in Step S1 and performing the standard wet edgebead removal operation in Step S2. However, before performing the standard exposure and developing processes, a secondary edgebead removal operation is carried out as in Step S3. After the secondary edgebead removal operation is performed in Step S3, the standard exposure and developing process steps are performed as shown in Steps S4 and S5.

The resist layer deposit process incorporating the principles of the present invention including the secondary edgebead removal process is described in connection with FIGS. 3 and 4. The process steps which are implemented in FIGS. 3 and 4 may be performed by any standard resist coater equipment capable of handling the spin speeds which will be discussed below as well as capable of dispensing solvent below the wafer through the back side for a period of time necessary to clear a two to three millimeter ring around the wafer's edge. In particular, this process can be implemented only on standard coater equipment which are capable of back side dispense of edgebead solvent and developer mounted wafer edge exposure capability. Such standard systems are, for example, Tokyo Electron's Mark 5 and Mark 7 track systems, the MPI Multifab System or the Silicon Valley Group System 90 coater equipment.

Figure 6:
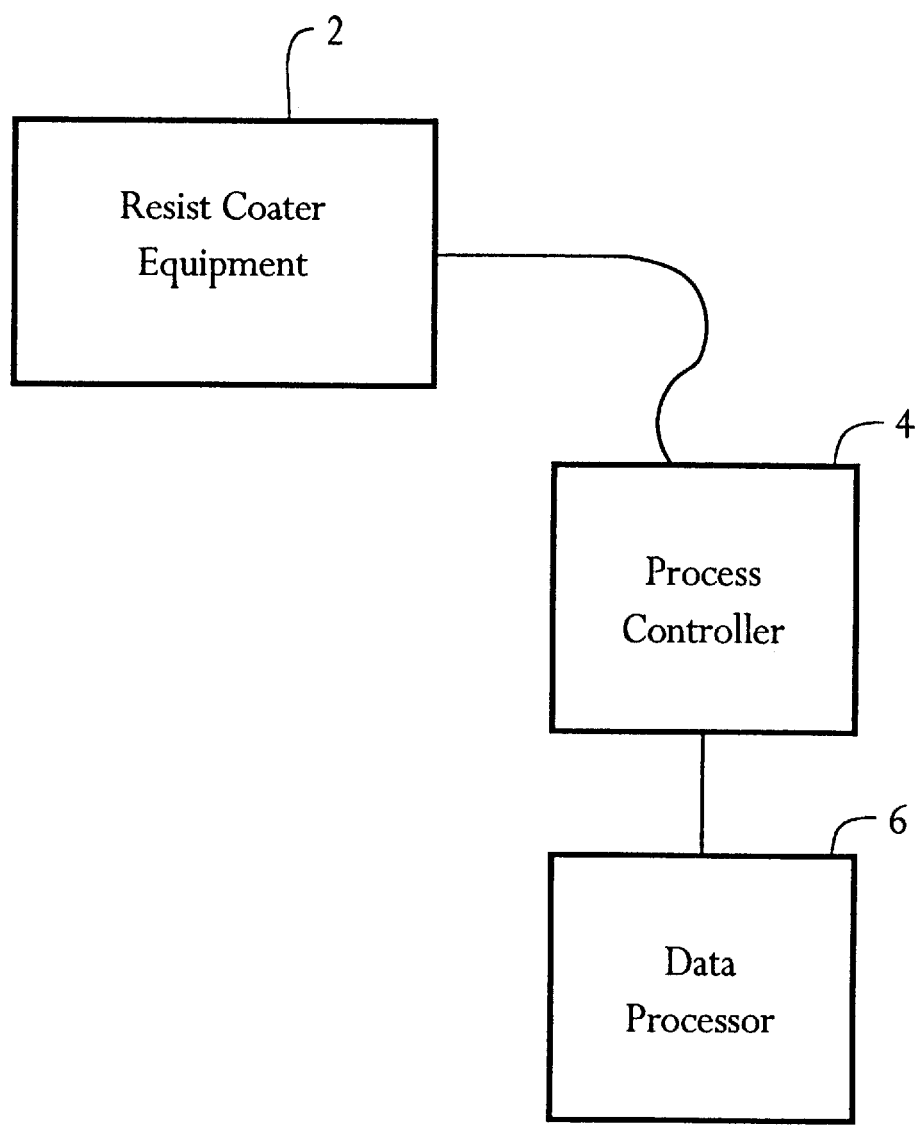
FIG. 6 is a block diagram illustrating the coater equipment implementing the secondary edgebead removal operation of the present invention.

The standard resist coater equipment may be programmably driven to perform the required process steps. Thus, the process steps illustrated in FIGS. 3 and 4 involving the secondary edgebead removal process may be programmed to be performed by the resist coater equipment. As shown in FIG. 6, the resist coater (and wafer edge exposure tool) equipment 2 is driven by process controller 4 which instructs resist coater equipment 2 to perform the required process steps. Process controller 4 is, in turn, driven by data processor 6 which contains the programmed process steps. Data processor 6 implements the specific process steps as contained in the instruction set or program.

Figure 7:
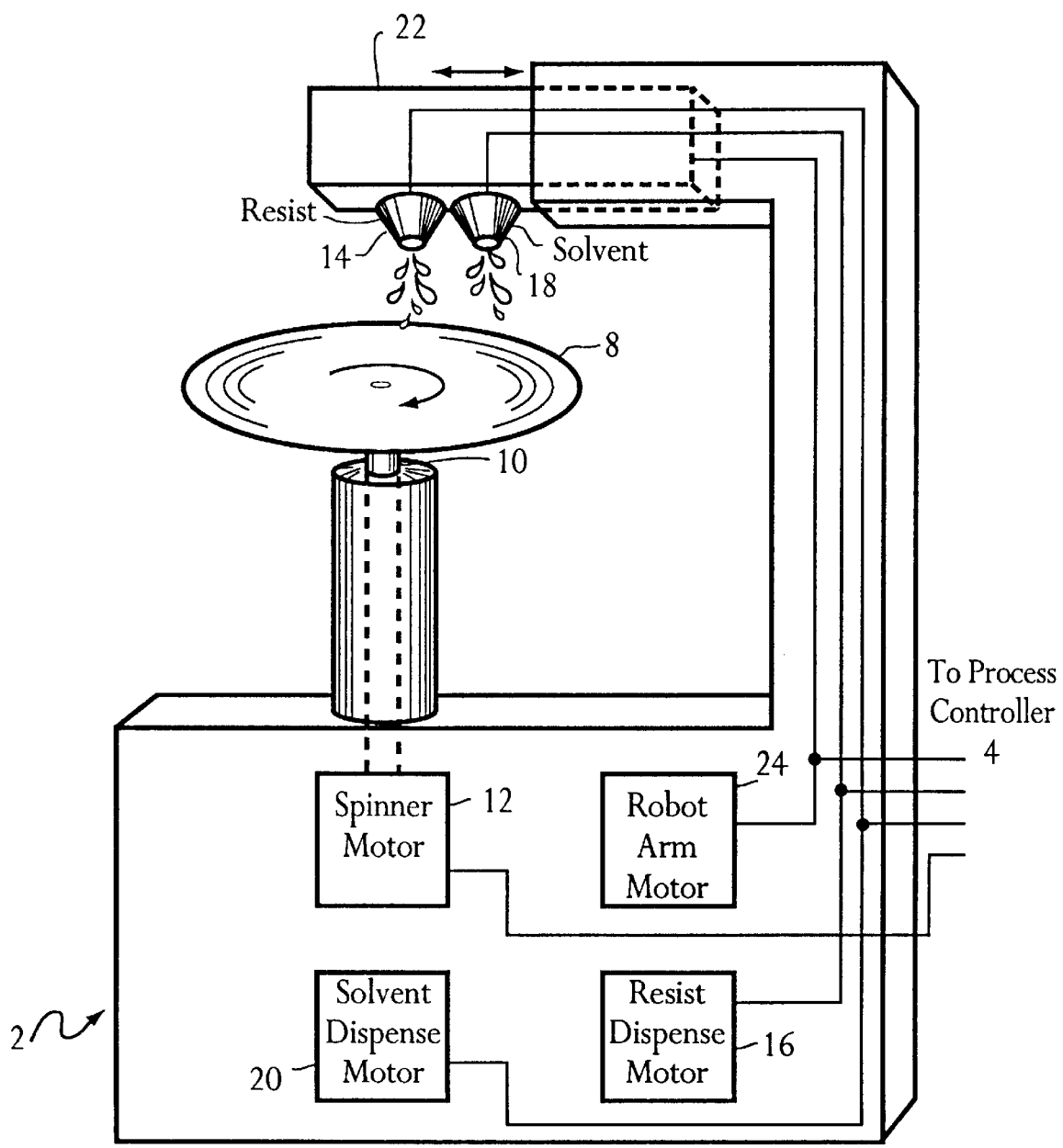
FIG. 7 is a block diagram illustrating in detail the coater equipment shown in FIG. 6.

Coater equipment 2 illustrated in FIG. 6 is illustrated in greater detail in FIG. 7. Specifically, coater equipment 2 includes spinning surface 8 upon which the semiconductor wafer is disposed and which is spun responsive to shaft 10 driven by spinner motor 12. Resist dispenser 14 may dispense the resist material on the semiconductor wafer at a rate which is driven by resist dispense motor 16. Solvent dispenser 18 may dispense the solvent onto the semiconductor wafer at a rate determined by resist dispense motor 16. The positioning of the resist and solvent material may be controlled via robot arm 22 under the control of robot controller 24. Spinner motor 12, resist dispense motor 16, solvent dispense motor 20 and robot arm motor 24 are all connected to, and operate responsive to the instructions generated by process controller 4.

Alternatively, the solvent may be positioned onto the semiconductor wafer in accordance with a predetermined position of the semiconductor wafer, and the solvent is pressure dispensed onto the predetermined area. The positioning of the solvent may then be controlled via the spinning of the semiconductor water by, for example, shaft 10. Further, other solvent dispense techniques may be used.

Figure 3:
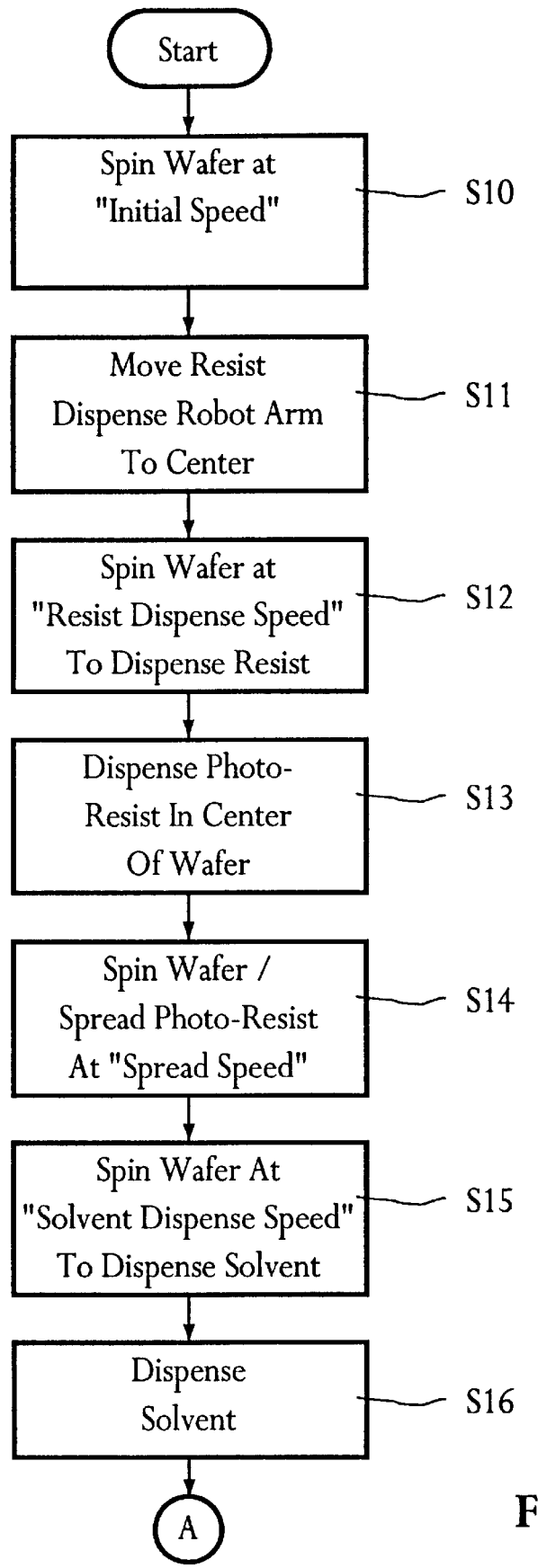
FIG. 3 is a detailed flowchart of the secondary edgebead removal operation of the present invention.
Figure 4:
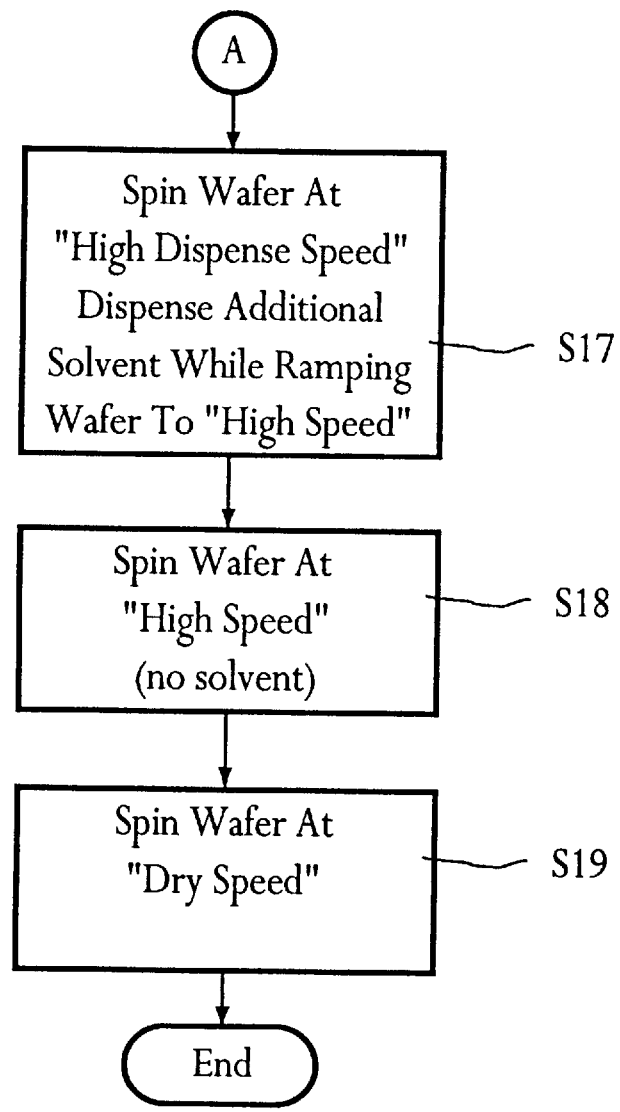
FIG. 4 is a detailed flowchart continuing the detailed description of the secondary edgebead removal operation of the present invention of FIG. 3.

As shown in FIG. 3, the semiconductor wafer is spun by coater equipment 2 at an initial speed which, in this example, is approximately 600 revolutions per minute (RPM) in Step S10. Next, a robot arm which is used to dispense the resist material is moved to the center of the semiconductor wafer in Step S11. The semiconductor wafer is then spun at a speed to receive the resist material which may be called the "resist dispense speed" in Step S12. In this example, the resist dispense speed is approximately 1200 RPM. The resist material is then dispensed via the robot arm of coater equipment 2 under the control of process controller 4 into the center of the wafer in Step S13 for a period of approximately 4 seconds and at a rate of approximately one milliliter (or one cubic centimeter) per second.

The wafer is then spun at a speed for spreading the resist material over the surface of a semiconductor wafer at a "spread speed" for approximately 8 seconds in Step S14. The spread speed in this example is approximately 1930 RPM, but may be varied according to the desired thickness of the resist material onto the wafer. The resist material utilized for this example was a 1.56 micrometer thick photo resist material which is soluble by an appropriate solvent. The specific resist used was KTI895I photo resist manufactured by OCP Corp., however, any photo resist which is soluble via an appropriate solvent may be used. During Step S14, the standard edgebeads are typically formed at the edge of the semiconductor wafer as shown in FIG. 5(a).

In Step S15, the wafer is then spun at a "solvent dispense speed" for receiving solvent to remove the edgebeads formed on the semiconductor in Step S15. The solvent is preferably dispensed at the back of the wafer and the centrifugal force of the spinning wafer permits the solvent to reach the edges of the wafer to remove the edgebeads in a selective manner. The solvent dispense speed is preferably approximately 370 RPM and performed over an approximately 10 second interval at which time the solvent is dispensed at a rate of approximately three milliliters per second in Step S16. Of course, any suitable dispense agent may be used when removing the edgebeads. Steps S15 and S16 represent the standard wet edgebead removal operation which produces the hillocks illustrated in FIG. 5(b).

The semiconductor wafer is then spun at a high speed for dispensing additional solvent; the high speed is called the "high dispense speed." The high dispense speed is preferably approximately 4,000 RPM which is performed over a 5 second interval. During the 5 second interval, the spin speed of the semiconductor is preferably ramped up from the previous lower speed or solvent dispense speed of 370 RPM to the high speed 4,000 RPM while solvent is being dispensed onto the semiconductor wafer for the 5 second interval at a rate of approximately three milliliters per second in Step S17. This additional amount of solvent which is introduced to the semiconductor wafer softens the hillocks to permit the hillocks to be flattened or reduced when subjected to the high speed spin operation.

The wafer is then spun at the high speed for an additional 15 seconds to further flatten or reduce the hillock resist material which accumulates at the edge of the wafer in Step S18. The results of Step S18 are illustrated in FIG. 5(c). Finally, the wafer is then spun at a "dry speed" which is approximately 1500 RPM to dry the resist material which has been deposited on the semiconductor wafer and subjected to the wet edgebead operation and the secondary edgebead removal operations.

After the wafer is spun at the dry speed, the resist-coated wafer is subjected to the standard exposure and developing techniques which are able to completely or substantially eliminate the residual secondary edgebeads as shown in FIG. 5(d). Note that the above time intervals and spin speeds which have been used in accordance with the principles of the present invention represent the preferred settings and other time intervals and spin speeds may be used. without departing from the scope of the present invention. For example, the high speed which is used in Step S17 may typically vary from 3000 RPM and higher, and the low speed which is used in Steps S15 and S16 for dispensing the solvent may vary between approximately 250 and 500 RPM.

In accordance with the principles of the present invention, residual secondary edgebeads can be prevented from forming on the surface of the semiconductor substrate which results from the standard wet edgebead operation used to remove edgebeads formed during the resist deposit process. Since these residual secondary edgebeads are a significant source of defects in the manufacturing process of the semiconductor wafer, significantly higher device yields can be obtained, dramatically increasing the efficiency of the semiconductor manufacturing process and creating great savings in the manufacture of semiconductor wafers with devices embedded therein.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, we do not desire to limit the invention to the exact construction and operation illustrated and described, and accordingly, all suitable modifications and equivalents may be resorted to, falling within the scope of the invention.

What is claimed is:

1. A method of using coater equipment capable of dispensing solvent on a back side of a semiconductor wafer having an edge and capable of exposing the edge of the semiconductor wafer, the method for flattening resist mounds formed during a wet edgebead operation which is used to remove edgebeads formed when a resist material is deposited on the semiconductor wafer, the method comprising the steps of:

(a) introducing solvent to the semiconductor wafer at an area containing the resist mounds to soften the resist mounds while spinning the semiconductor wafer at a rate from approximately 250 to 500 revolutions per minute; and (b) spinning the semiconductor wafer at a rate of about 3000 revolutions per minute or higher to flatten the resist mounds.

2. A method according to claim 1, wherein said steps (a) and (b) are performed simultaneously.

3. A method according to claim 1, wherein said step (b) is performed as the rate at which the semiconductor wafer is spun is increased from the rate in said step (a).

4. A new use according to claim 1, wherein said step (b) is performed as the rate at which the semiconductor wafer is spun is increased from the approximately 250–500 revolutions per minute in said step (a).

5. A method according to claim 1, wherein said step (a) further comprises the step of introducing the solvent to the semiconductor wafer at the area containing the resist mounds while spinning the semiconductor wafer at a relatively low rate for a first time interval, and wherein said step (b) further comprises the step of spinning the semiconductor wafer at the rate higher than the relatively low rate for a second time interval.

6. A method according to claim 1, wherein said step (a) further comprises the step of introducing the solvent to the semiconductor wafer at the area containing the resist mounds while spinning the semiconductor wafer at a relatively low rate for a first time interval, and wherein said spinning step (b) further comprises the steps of:

(b1) introducing a second solvent to the semiconductor wafer at a second area while spinning the semiconductor wafer at a higher rate for a second time interval; and (b2) spinning the semiconductor wafer at the higher rate for a third time interval.

7. A method according to claim 1, further comprising the steps of:

(c) exposing the resist material deposited onto the semiconductor wafer to light in accordance with a prescribed pattern; and (d) developing the resist material deposited onto the semiconductor wafer for device implantation in accordance with the pattern exposed in said exposing step (c).

8. A method of using coater equipment capable of dispensing solvent on a back side of a semiconductor wafer having an edge and capable of exposing the edge of the semiconductor wafer, the method for flattening resist mounds formed during a wet edgebead operation which is used to remove edgebeads formed when a resist material is deposited on the semiconductor wafer, the method comprising the steps of:

(a) introducing solvent to the semiconductor wafer at an area containing the resist mounds to soften the resist mounds while spinning the semiconductor wafer at a rate from approximately 250 to 500 revolutions per minute; and (b) spinning the semiconductor wafer at a rate sufficient to flatten the resist mounds wherein the rate at which the semiconductor is spun in step (b) is increased from the rate of approximately 250 to 500 revolutions per minute in step (a).

9. A method according to claim 8, wherein said steps (a) and (b) are performed simultaneously.

10. A method according to claim 8, wherein said step (a) further comprises the step of introducing the solvent to the semiconductor wafer at the area while spinning the semiconductor wafer at a relatively low rate for a first time interval, and wherein said step (b) further comprises the step of spinning the semiconductor wafer at the rate higher than the relatively low rate for a second time interval.

11. A method according to claim 8, wherein said step (a) further comprises the step of introducing the solvent to the semiconductor wafer at the area while spinning the semiconductor wafer at a relatively low rate for a first time interval, and wherein said spinning step (b) further comprises the steps of:

(b1) introducing a second solvent to the semiconductor wafer at a second area while spinning the semiconductor wafer at a higher rate for a second time interval; and (b2) spinning the semiconductor wafer at the higher rate for a third time interval.

12. A method according to claim 8, further comprising the steps of:

(c) exposing the resist material deposited onto the semiconductor wafer to light in accordance with a prescribed pattern; and (d) developing the resist material deposited onto the semiconductor wafer for device implantation in accordance with the pattern exposed in said exposing step (c).

13. A method of using coater equipment capable of dispensing solvent on a back side of a semiconductor wafer having an edge and capable of exposing the edge of the semiconductor wafer, the method for flattening resist mounds formed during a wet edgebead operation which is used to remove edgebeads formed when a resist material is deposited on the semiconductor wafer, the method comprising the steps of:

(a) introducing solvent to the semiconductor wafer at an area containing the resist mounds to soften the resist mounds;

(b) spinning the semiconductor wafer at a rate sufficient to flatten the resist mounds;

(c) exposing the flattened resist mounds to light; and (d) developing the exposed resist mounds deposited onto the semiconductor wafer for substantial removal thereof.

* * * * *